(12) United States Patent
Gao et al.

(10) Patent No.: US 12,501,588 B2
(45) Date of Patent: Dec. 16, 2025

(54) COOLING SYSTEM AND RACK INCLUDING THE SAME

(71) Applicants: Lite-On Singapore Pte Ltd, Singapore (SG); Lite-On Technology Corporation, Taipei (TW)

(72) Inventors: Peng Gao, Singapore (SG); Jiayin Ang, Singapore (SG); Jerald Lee, Singapore (SG); Wen-Chi Chen, Taipei (TW)

(73) Assignees: Lite-On Singapore Pte Ltd, Singapore (SG); Lite-On Technology Corporation, Taipei (TW)

( * ) Notice: Subject to any disclaimer, the term of this patent is extended or adjusted under 35 U.S.C. 154(b) by 203 days.

(21) Appl. No.: 18/481,252

(22) Filed: Oct. 5, 2023

(65) Prior Publication Data

US 2025/0031351 A1    Jan. 23, 2025

(30) Foreign Application Priority Data

Jul. 21, 2023 (TW) .................... 112207669

(51) Int. Cl.
*H05K 7/20*     (2006.01)

(52) U.S. Cl.
CPC ..... *H05K 7/20781* (2013.01); *H05K 7/20927* (2013.01)

(58) Field of Classification Search
None
See application file for complete search history.

(56) References Cited

U.S. PATENT DOCUMENTS

| | | | |
|---|---|---|---|
| 7,318,322 B2 | 1/2008 | Ota et al. | |
| 10,905,031 B1* | 1/2021 | Gao | H05K 7/20772 |
| 11,980,008 B2* | 5/2024 | Gao | H05K 7/20781 |
| 12,356,584 B2* | 7/2025 | Heydari | H05K 7/20254 |
| 2018/0084671 A1* | 3/2018 | Matsumoto | H05K 7/20772 |
| 2018/0279510 A1 | 9/2018 | Johnson et al. | |
| 2020/0029464 A1* | 1/2020 | Inano | H05K 7/20272 |
| 2021/0320048 A1 | 10/2021 | Limaye et al. | |
| 2022/0151098 A1* | 5/2022 | Junkins | H05K 7/20254 |
| 2022/0183181 A1* | 6/2022 | Montes Monteserin | H05K 7/20236 |
| 2022/0369493 A1 | 11/2022 | Alissa et al. | |
| 2022/0369504 A1* | 11/2022 | Clerc | H05K 7/20272 |
| 2023/0057989 A1* | 2/2023 | Heusler | H02K 5/02 |
| 2023/0084765 A1* | 3/2023 | Gao | H05K 7/20254 361/679.53 |
| 2024/0260228 A1* | 8/2024 | Chuang | H05K 7/20236 |

\* cited by examiner

*Primary Examiner* — Courtney L Smith
(74) *Attorney, Agent, or Firm* — JCIPRNET

(57) ABSTRACT

A cooling system, including an outer casing, a chassis, a heat source, and a cooling unit, is provided. The outer casing has a first surface and includes a water inlet and a water outlet arranged on the first surface. The chassis is disposed in the outer casing. The heat source is disposed in the chassis. The cooling unit contacts the chassis and is configured to cool the heat source. A rack including the cooling system is also provided.

14 Claims, 15 Drawing Sheets

COOLING SYSTEM AND RACK INCLUDING THE SAME

CROSS-REFERENCE TO RELATED APPLICATION

This application claims the priority benefit of Taiwan application serial no. 112207669, filed on Jul. 21, 2023. The entirety of the above-mentioned patent application is hereby incorporated by reference herein and made a part of this specification.

BACKGROUND

Technical Field

The invention relates to a cooling system, and in particular to a cooling system having a water inlet and a water outlet.

Description of Related Art

A data center rack is generally used to accommodate a server, a power shelf, a busbar, cables, and other information technology equipment (ITE).

With the development of technology, high-density data center racks need to have corresponding cooling means to properly cool the heat sources in the server and the power shelf to prevent heat accumulation.

SUMMARY

The invention provides a cooling system, which has excellent cooling effect.

A cooling system of the invention includes an outer casing, a chassis, a heat source, and a cooling unit. The outer casing has a first surface and includes a water inlet and a water outlet disposed on the first surface. The chassis is disposed in the outer casing. The heat source is disposed in the chassis. The cooling unit contacts the chassis and is configured to cool the heat source.

A rack of the invention includes a rack body and the cooling system. The cooling system is disposed on the rack body.

In an embodiment of the invention, the outer casing includes a notch opposite to the first surface, and the chassis is suitable for being inserted into the outer casing via the notch.

In an embodiment of the invention, the cooling unit includes a tube disposed between an inner wall surface of the outer casing and the chassis, a first end of the tube is connected to the water inlet, and a second end of the tube is connected to the water outlet.

In an embodiment of the invention, the tube includes a U-shaped segment, the U-shaped segment is connected between the first end and the second end, and a lower surface of the U-shaped segment has an inclined surface.

In an embodiment of the invention, the tube includes a first segment and a second segment arranged side by side, the first segment is connected between the first end and the U-shaped segment, the second segment is connected between the second end and the U-shaped segment, a holder is disposed between the first segment and the second segment, the inner wall surface of the outer casing is provided with a shaft body, and the shaft body is connected to the holder.

In an embodiment of the invention, the inner wall surface of the outer casing is provided with an elastic member disposed between the tube and the inner wall surface of the outer casing.

In an embodiment of the invention, an interconnector is disposed in the outer casing, the interconnector has a channel, an end of the channel is connected to the water inlet or the water outlet, and a first wall surface of the channel has two or more water pipes.

In an embodiment of the invention, a second inner wall of the channel is inclined relative to a first inner wall.

In an embodiment of the invention, there is an included angle between a tangent of the first inner wall and a tangent of the second inner wall, and the included angle is between 88.5 degrees and 87 degrees.

In an embodiment of the invention, an inner wall of the chassis has a heat conduction unit, and the heat source is in contact with the chassis via the heat conduction unit.

In an embodiment of the invention, a cooling colloid is arranged between an inner surface of the chassis and the heat source.

In an embodiment of the invention, the cooling system further includes a cover plate, the outer casing has an opening, the cover plate covers the opening to form a chamber with the outer casing, and the chassis is disposed in the chamber.

In an embodiment of the invention, the cooling unit is a coolant filled into the chamber, and the cooling system further includes a sealing ring disposed between the cover plate and the outer casing.

In an embodiment of the invention, the rack further includes a coolant distribution unit, the coolant distribution unit is disposed on the rack body and includes a first circulation path and a second circulation path, the first circulation path connects the coolant distribution unit and at least two of the water inlets, and the second circulation path connects the coolant distribution unit and at least two of the water outlets.

Based on the above, in the cooling system of the invention, the cooling unit contacts the chassis and is used to cool the heat source in the chassis. In this way, the heat source can be properly cooled to prevent heat accumulation.

To make the features and advantages of the invention more comprehensible, the following embodiments are incorporated with the drawings and described in detail.

DESCRIPTION OF THE EMBODIMENTS

Figure 1A:
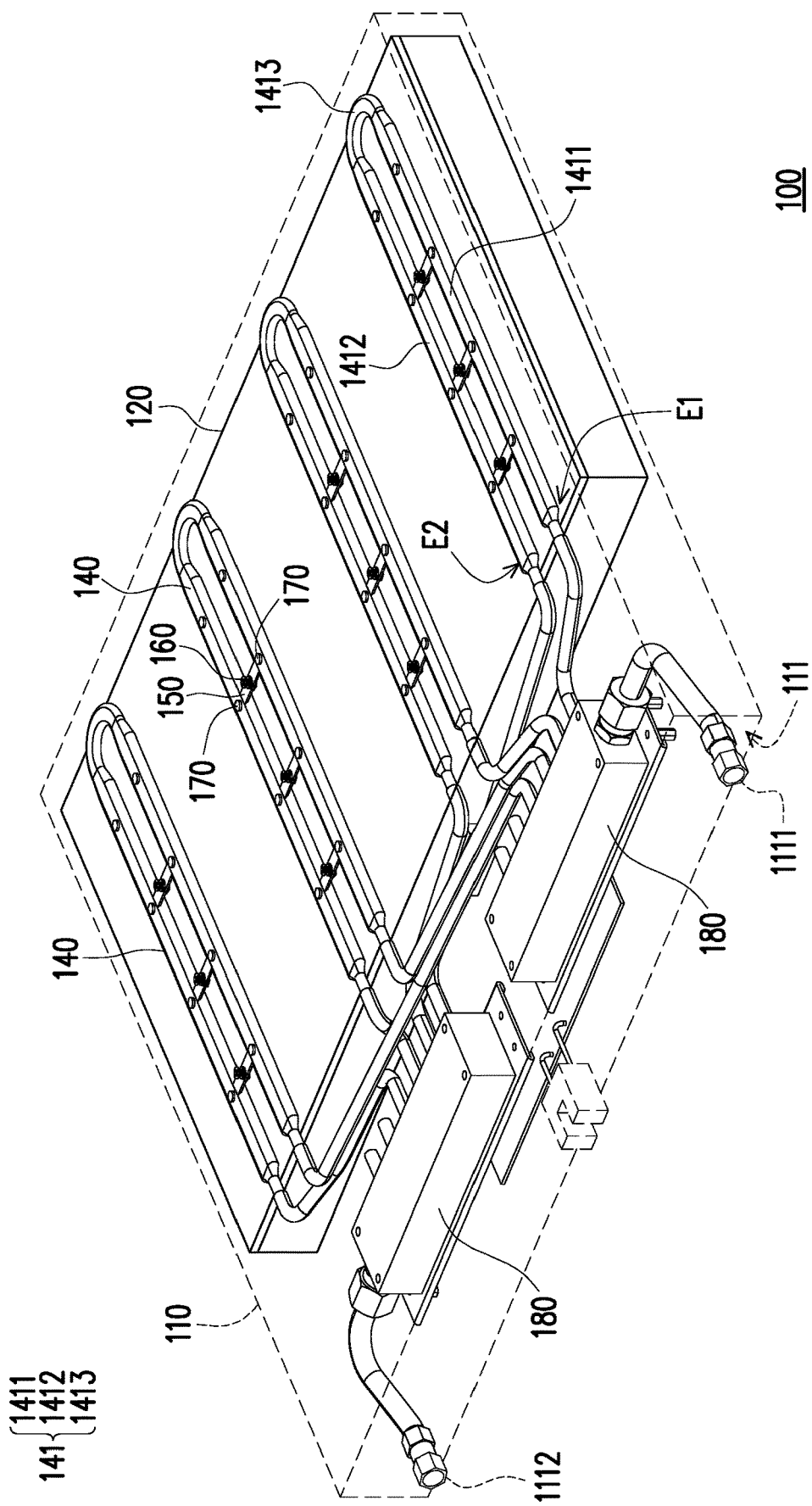
FIG. 1A is a schematic view of a cooling system according to an embodiment of the invention.
Figure 1B:
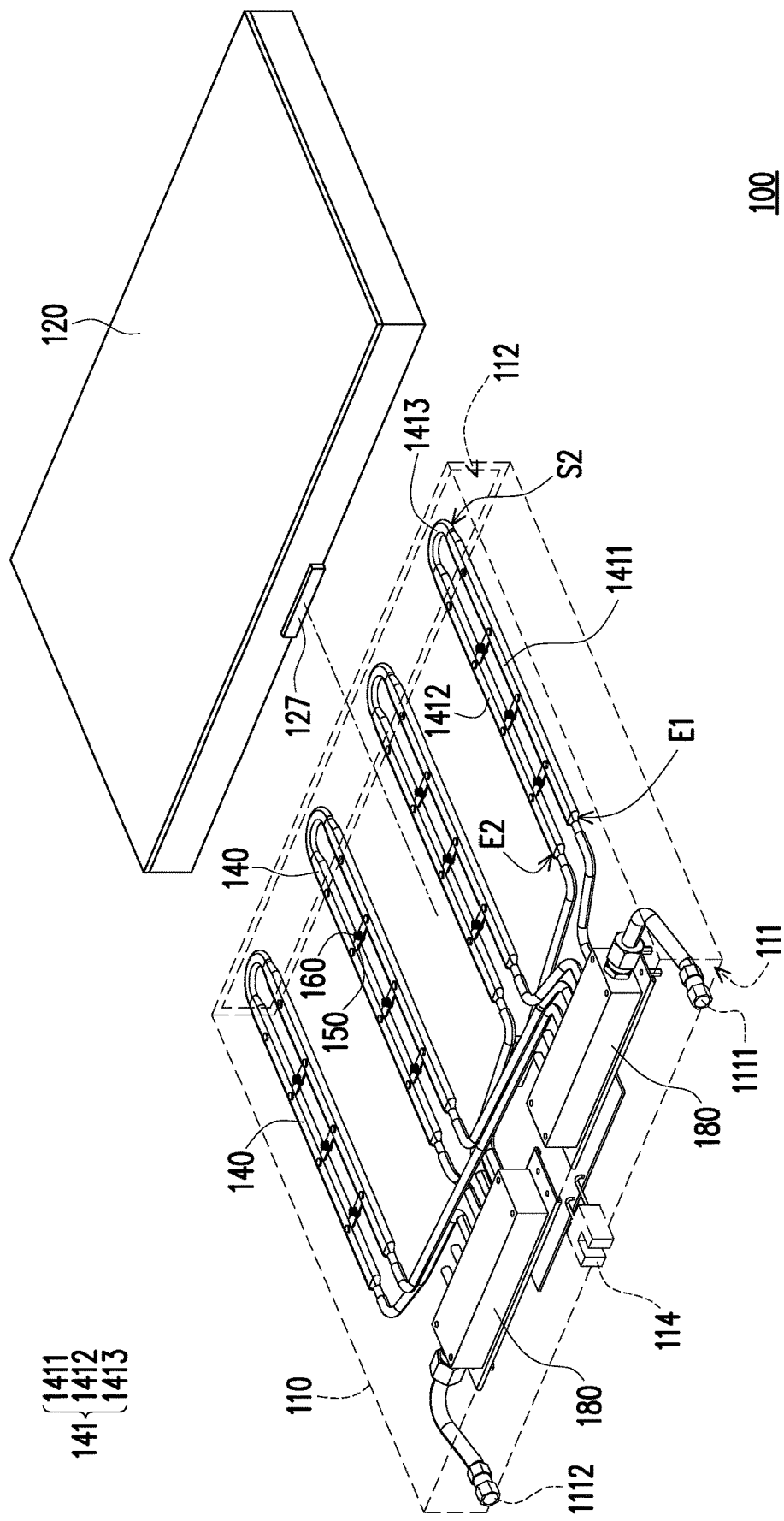
FIG. 1B is a disassembled schematic view of the cooling system of FIG. 1A.
Figure 1C:
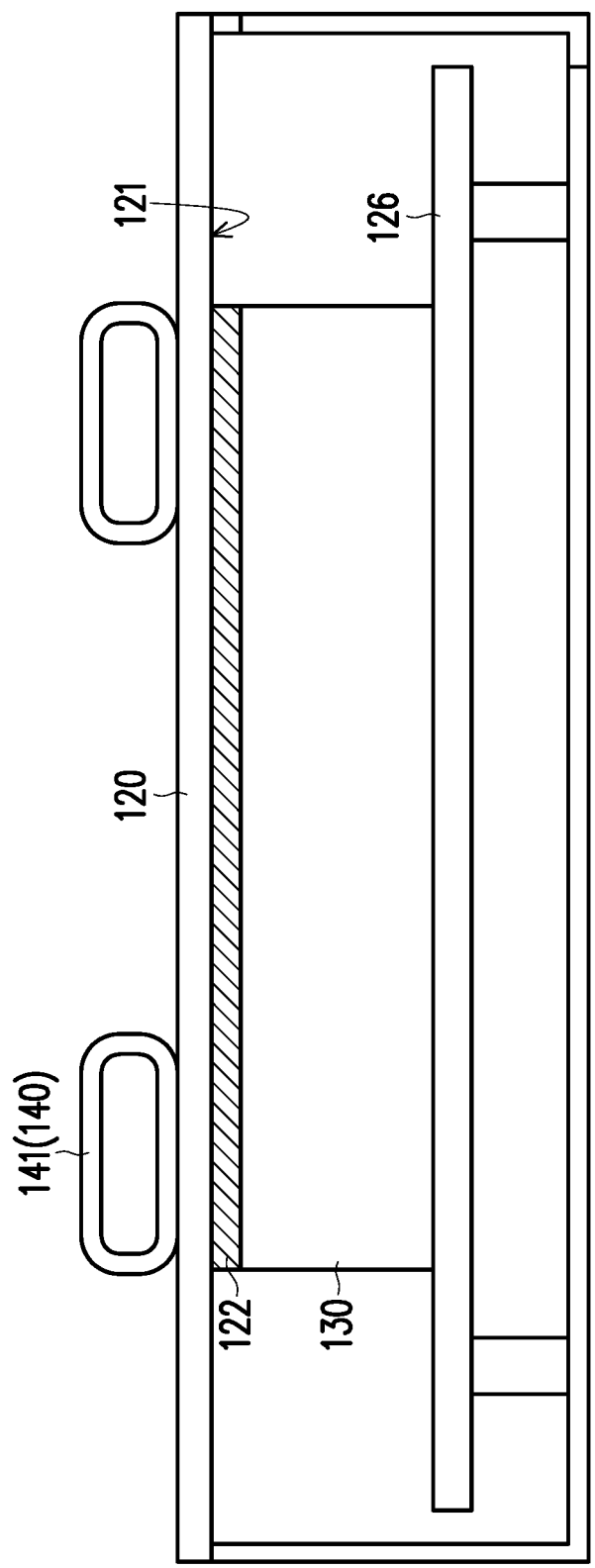
FIG. 1C is a cross-sectional schematic view of a chassis and a cooling unit of FIG. 1A.
Figure 2:
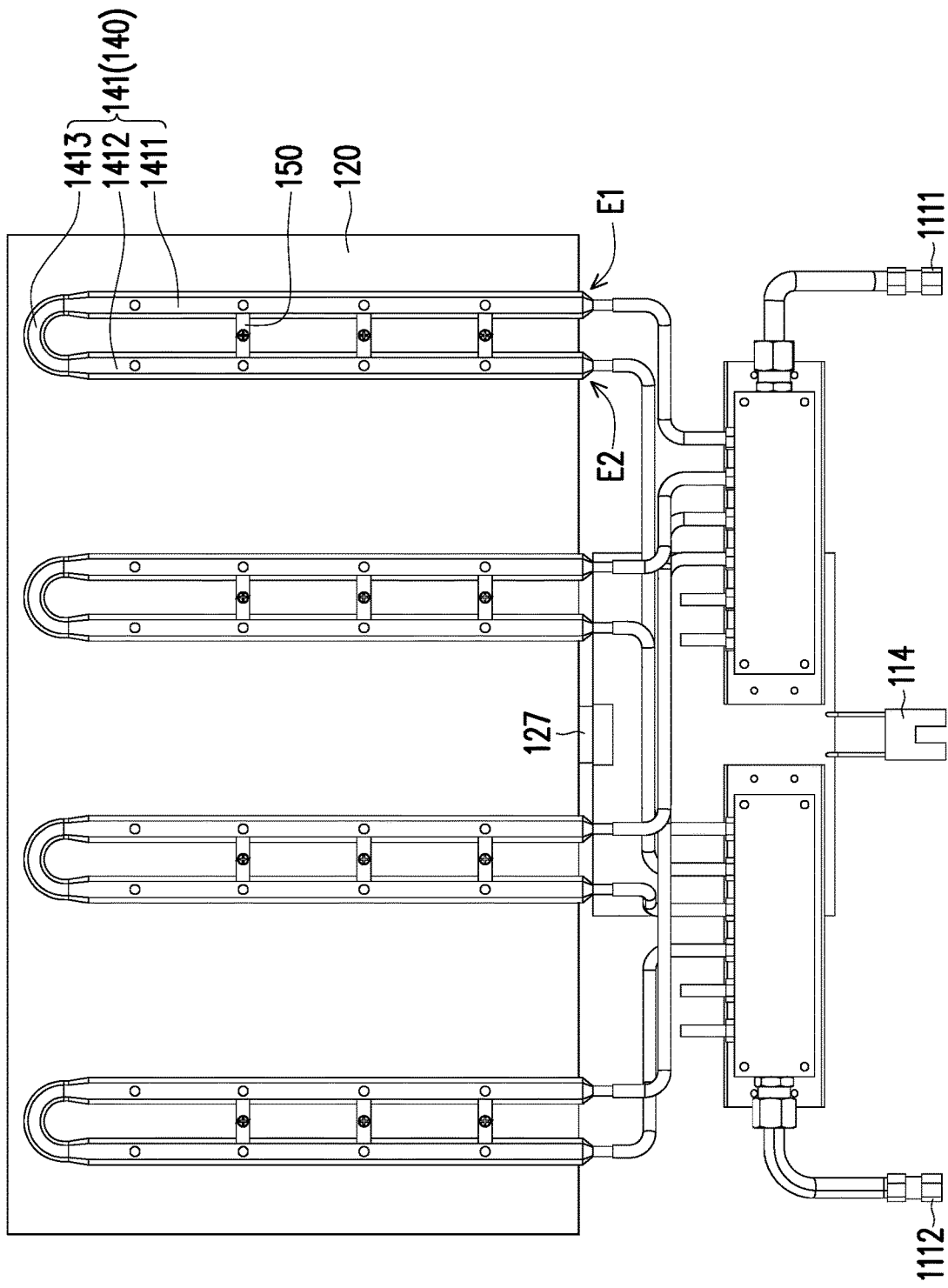
FIG. 2 is a top view of the cooling system of FIG. 1A.

FIG. 1A is a schematic view of a cooling system according to an embodiment of the invention. FIG. 1B is a disassembled schematic view of the cooling system of FIG. 1A. FIG. 1C is a cross-sectional schematic view of a chassis and a cooling unit of FIG. 1A. FIG. 2 is a top view of the cooling system of FIG. 1A. It should be noted that an outer casing in FIG. 1A and FIG. 1B is shown by dotted lines to clearly illustrate the interior, and the illustration of the outer casing is omitted in FIG. 1C and FIG. 2.

Please refer to FIG. 1A and FIG. 1B. A cooling system 100 of the embodiment includes an outer casing 110, a chassis 120, and a cooling unit 140. The outer casing 110 has a first surface and includes a water inlet 1111 and a water outlet 1112 disposed on the first surface 111. The chassis 120 is disposed in the outer casing 110. A surface of the chassis 120 is provided with an electrical connector 127, and the electrical connector 127 is directly or indirectly connected to the electrical connector 114 of the outer casing 110, but the invention is not limited thereto.

In the embodiment, the outer casing 110 includes a notch 112 opposite to the first surface 111, and the chassis 120 is adapted to be inserted into the outer casing 110 or pulled out from the outer casing 110 via the notch 112. In this way, when loading and unloading the chassis 120, there is no need to connect nor disconnect liquid pipelines to the chassis 120, which is convenient for maintenance and prevents water leakage and potential safety hazards.

Please refer to FIG. 1C. In the embodiment, the cooling system 100 includes a heat source 130. The heat source 130 is disposed in the chassis 120. The cooling unit 140 contacts the chassis 120 and is configured to cool the heat source 130. In the embodiment, the chassis 120 is a server, but the invention is not limited thereto. The heat source 130 in the chassis 120 is, for example, a central processing unit (CPU), a graphics processing unit (GPU), a storage equipment, a printed circuit board assembly (PCBA), a power supply unit (PSU), etc., but the invention is not limited thereto.

Please refer to FIG. 2. In the embodiment, the cooling unit 140 includes a thin and flat tube 141. The inside of the tube 141 may be used for a liquid (for example, a coolant) to flow, a first end E1 of the tube 141 is connected to the water inlet 1111, and a second end E2 of the tube is connected to the water outlet 1112. Specifically, the tube 141 includes a U-shaped segment 1413. The U-shaped segment 1413 is connected between the first end E1 and the second end E2. The tube 141 includes a first segment 1411 and a second segment 1412 arranged side by side. The first segment 1411 and the second segment 1412 are straight segments. The first segment 1411 is connected between the first end E1 and the U-shaped segment 1413, and the second segment 1412 is connected between the second end E2 and the U-shaped segment 1413.

Figure 3A:
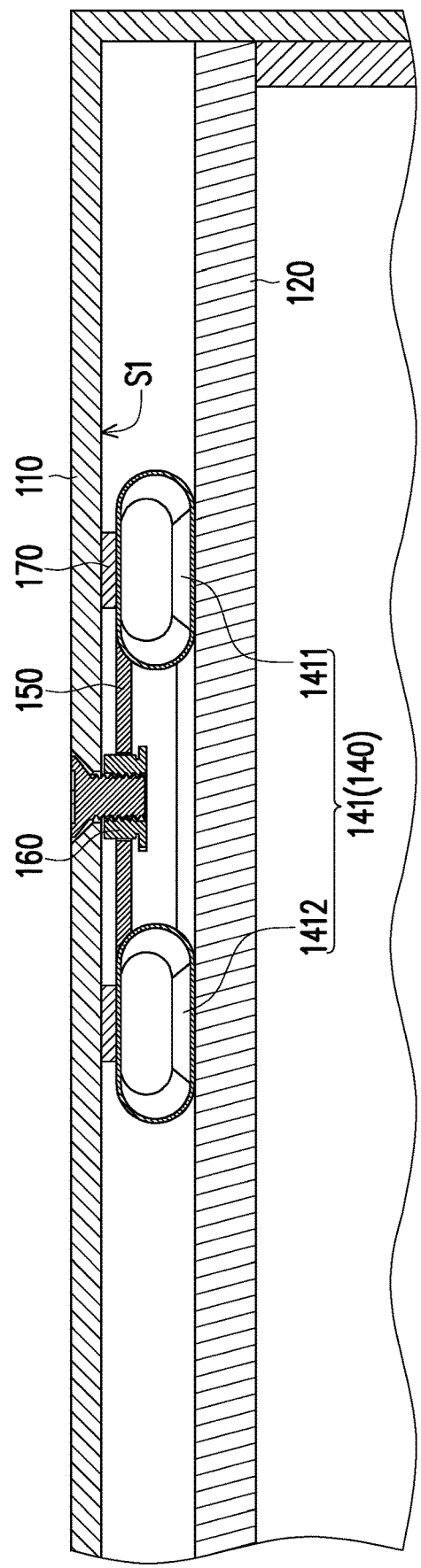
FIG. 3A is a cross-sectional view of the cooling system of FIG. 1A.

FIG. 3A is a cross-sectional view of the cooling system of FIG. 1A. Please refer to FIG. 3A. In the embodiment, the tube 141 is disposed between an inner wall surface S1 of the outer casing 110 and the chassis 120. A holder 150 is disposed between the first segment 1411 and the second segment 1412. The inner wall surface S1 of the outer casing 110 is provided with a shaft body 160. The shaft body 160 is connected to the holder 150, so that the tube 141 is floatingly installed on the inner wall surface S1 of the outer casing 110 via the shaft body 160, but the invention is not limited thereto.

Specifically, the inner wall surface S1 of the outer casing 110 is provided with an elastic member 170 disposed between the tube 141 and the inner wall surface S1 of the outer casing 110. The tube 141 elastically abuts against the inner wall surface S1 of the outer casing 110 via the elastic member 170. The elastic member 170 provides contact pressure between the tube 141 and the chassis 120 to implement preferable contact and effective heat transfer.

There is preferably a gap between the elastic member 170 and the tube 141 to maintain the elastic capacity of the elastic member 170. When the chassis 120 is inserted into the outer casing 110, the chassis 120 pushes the tube 141 of the cooling unit 140 to be lifted up, so as to eliminate the gap between the elastic member 170 and the tube 141, so that the tube 141 abuts against the elastic member 170. The reaction force or the pressure generated thereby enables the tube 141 of the cooling unit 140 to be in tight contact with the chassis 120, which can effectively transfer heat.

Figure 3B:
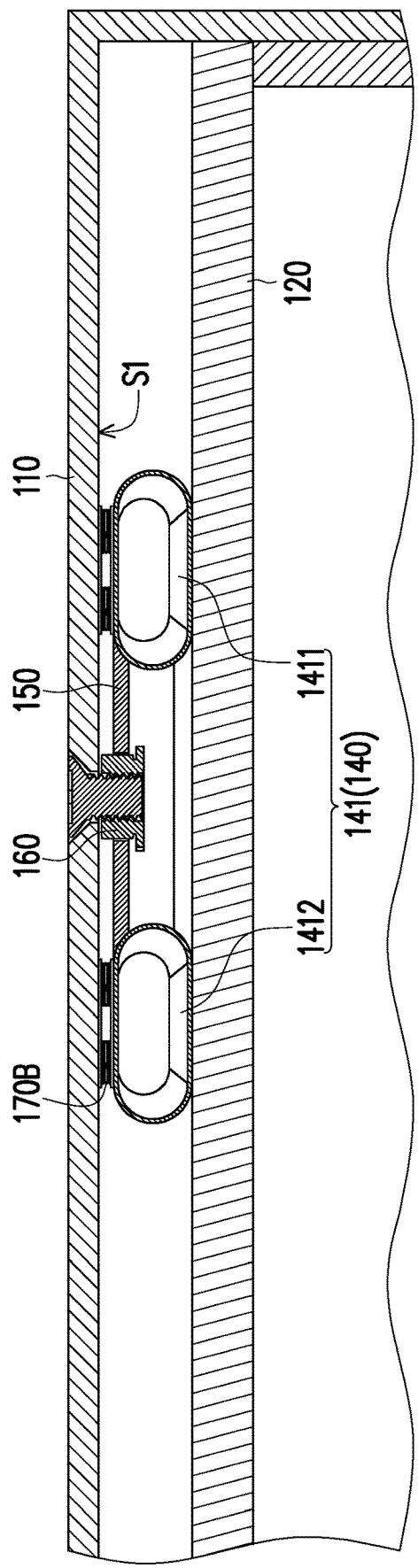
FIG. 3B is a cross-sectional view of a cooling system according to another embodiment of the invention.

In the embodiment, the elastic member 170 is, for example, a high elastic rubber pad, but the invention is not limited thereto. FIG. 3B is a cross-sectional view of a cooling system according to another embodiment of the invention. Please refer to FIG. 3B. In the embodiment, the inner wall surface S1 of the outer casing 110 is provided with an elastic member 170B. The elastic member 170B is, for example, a spring, but the invention is not limited thereto.

Figure 4:
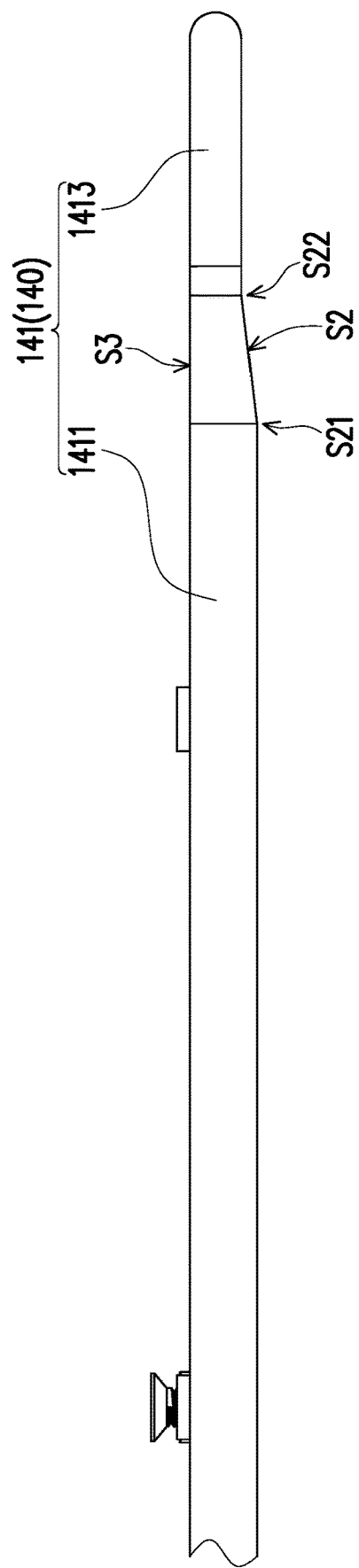
FIG. 4 is a side view of a tube of the cooling system of FIG. 1B.

FIG. 4 is a side view of a tube of the cooling system of FIG. 1B. Please refer to FIG. 1B and FIG. 4. In the embodiment, a lower surface of the U-shaped segment 1413 has an inclined surface S2. The inclined surface S2 has an endpoint S21 relatively close to the first surface 111 and an endpoint S22 relatively close to the notch 112. A distance between the endpoint S21 and an upper surface S3 of the tube 141 is greater than a distance between the endpoint S22 and the upper surface S3 of the tube 141.

In the embodiment, the design of the inclined surface S2 provides a guiding function upon insertion of the chassis 120 into the outer casing 110, so that the chassis 120 can be easily placed into the outer casing 110. In addition, the diameter of the U-shaped segment 1413 is preferably less than the diameter of the first segment 1411 and the second segment 1412, and less than a distance between the inclined surface S2 and the upper surface S3, so that the chassis 120 can be more easily placed into the outer casing 110.

In addition, in order to enhance heat dissipation, the tube may adapt to have various curvatures or folding manners to increase the contact area between the chassis 120 and the tube 141, but the invention is not limited thereto.

Figure 5:
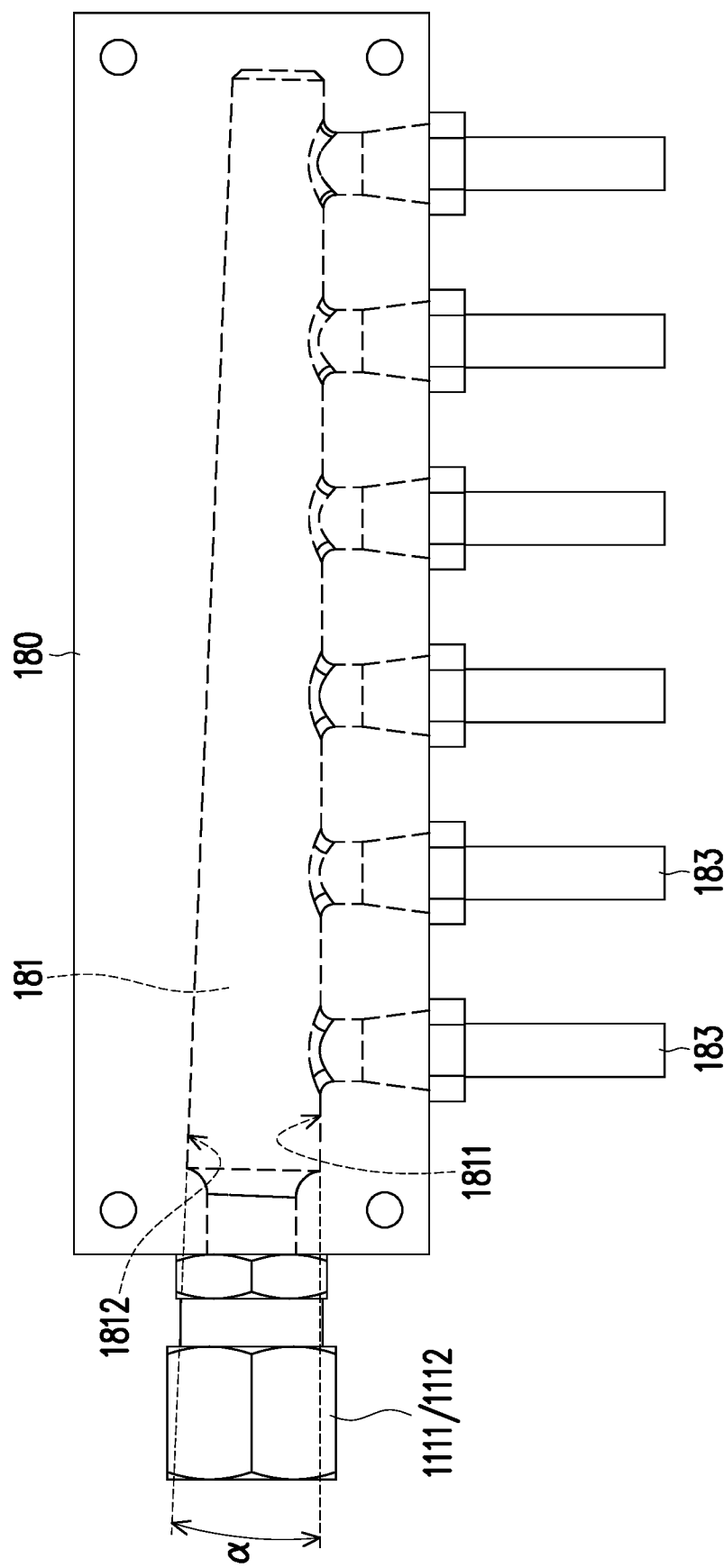
FIG. 5 is a partially enlarged schematic view of the cooling system of FIG. 1B.

FIG. 5 is a partially enlarged schematic view of the cooling system of FIG. 1B. Please refer to FIG. 5. In the embodiment, an interconnector 180 is disposed in the outer casing 110. The interconnector 180 has a channel 181. The channel 181 is basically a passage having a tapered diameter. In other words, the channel 181 has a first inner wall 1811 and a second inner wall 1812 inclined relative to each other. An end of the channel 181 is connected to the water inlet 1111 or the water outlet 1112. The first inner wall 1811 of the channel 181 has two or more water pipes 183. Each water pipe 183 is connected to corresponding tube 141.

Specifically, an included angle α is formed between the tangent of the first inner wall and the tangent of the second inner wall 1812. The included angle α is preferably between 88.5 degrees and 87 degrees. The advantage of such design is that the flow distribution may be adjusted, so that the flow rate of the liquid entering the water pipe 183 near the water inlet 1111 or the water outlet 1112 is approximately the same as the flow rate of the liquid entering the water pipe 183 away from the water inlet 1111 or the water outlet 1112. In this way, the cooling units could have uniform flow distributions to ensure consistent heat conduction.

In detail, please refer to FIG. 1C. In the embodiment, an inner wall 121 of the chassis has a heat conduction unit 122. The heat source 130 is disposed on a circuit board 126, the heat source 130 contacts the heat conduction unit 122 and is in contact with the chassis 120 via the heat conduction unit 122.

In the embodiment, the heat conduction unit 122 is, for example, a heat conduction sheet with a thermal conductivity of at least 200 W/mK and a thickness of at least 1.5 mm. The material of the heat conduction unit 122 is, for example, aluminum or copper, but the invention is not limited thereto. In the embodiment, the material of the chassis 120 is formed by a more robust material, e.g., steel, but the invention is not limited thereto.

In an embodiment, the heat of the heat source 130 is transferred to the heat conduction unit 122. Since the total volume of the heat conduction unit 122 is greater than the total volume of the heat source 130, the heat can be dissipated and hot spots can be reduced. In another embodiment, in order to fill air gaps caused by surface roughness and flatness of the heat source and the heat conduction unit 122, a thin layer of thermal grease may be applied between the heat source 130 and the heat conduction unit 122. Next, the heat from the heat conduction unit is transferred to the cooling unit 140 and is taken away by the liquid (the coolant) flowing in the tube 141.

Figure 6:
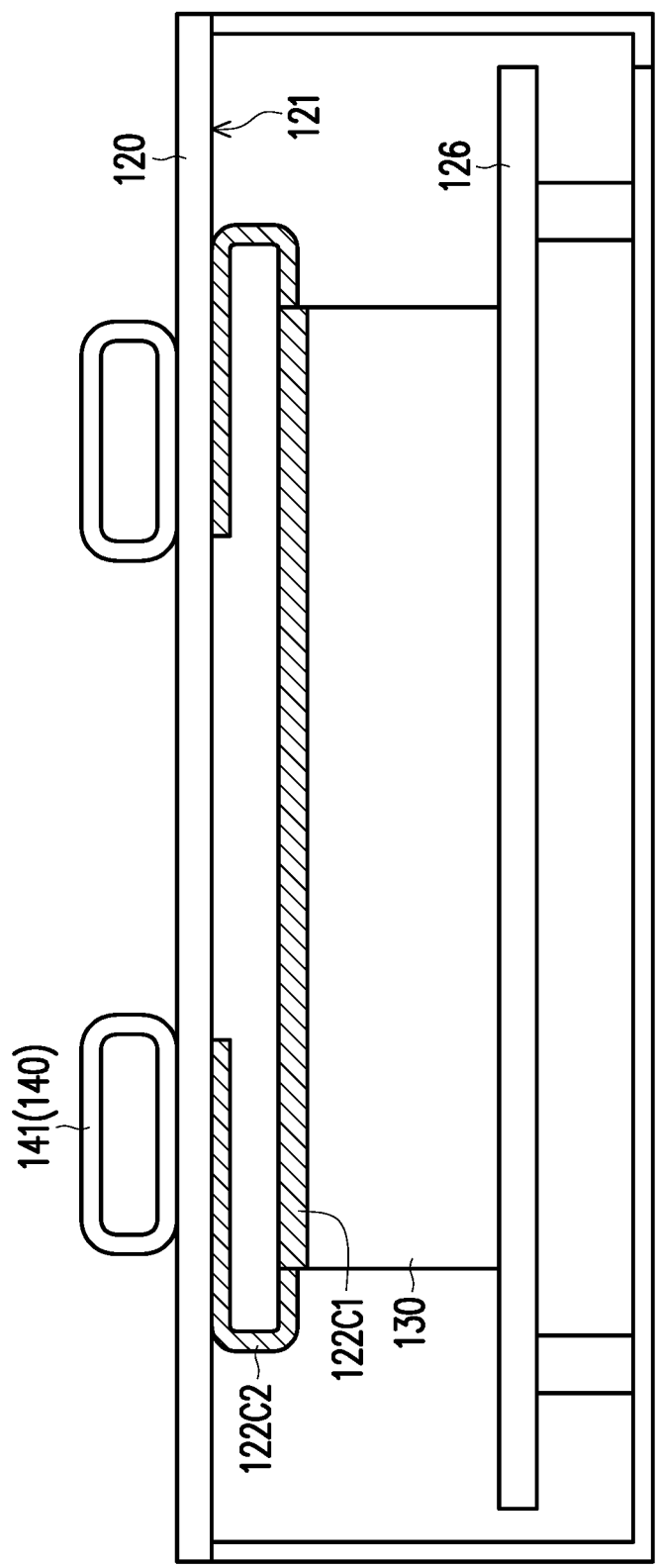
FIG. 6 is a schematic view of an interior of a chassis and a cooling unit according to another embodiment of the invention.

FIG. 6 is a schematic view of an interior of a chassis according to another embodiment of the invention. It should be noted that the illustration of an outer casing is omitted in FIG. 6. Please refer to FIG. 6. In the embodiment, the inner wall 121 of the chassis 120 has a heat conduction unit. The heat conduction unit includes a first heat conduction member 122C1 and a second heat conduction member 122C2. The heat source 130 contacts the first heat conduction member 122C1. An end of the second heat conduction member 122C2 contacts the first heat conduction member 122C1, and the other end contacts the inner wall 121 of the chassis 120. The second heat conduction member 122C2 is, for example, a heat pipe. The material of the first heat conduction member 122C1 is, for example, aluminum or copper, and the material of the second heat conduction member 122C2 is, for example, copper, but the invention is not limited thereto.

The first heat conduction member 122C1 and the second heat conduction member 122C2 may be made of the same or different high heat conduction materials. In this way, even if there is a relatively large clearance between the heat source 130 and the inner wall 121 of the chassis 120, heat can still be effectively transferred through the second heat conduction member 122C2.

Figure 7:
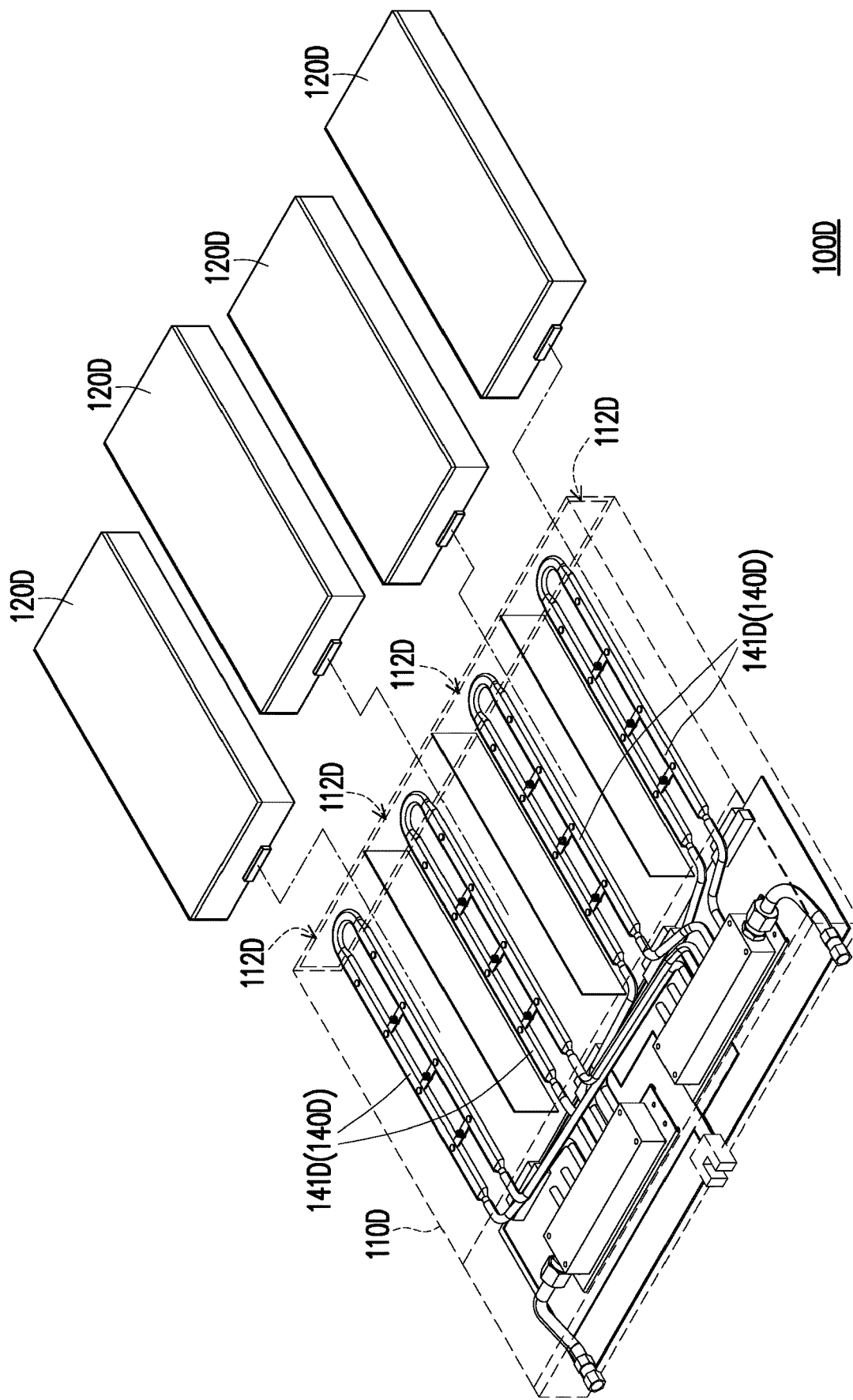
FIG. 7 is a disassembled schematic view of a cooling system according to another embodiment of the invention.

FIG. 7 is a disassembled schematic view of a cooling system according to another embodiment of the invention. Please refer to FIG. 7. In the embodiment, a cooling system 100D is slightly different from the cooling system 100 of FIG. 1B. The main difference is that the outer casing 110 has multiple notches 112D for multiple chassis 120D to be inserted or pulled out. Each of the tubes 141D of a cooling unit 140D correspond to a respective chassis 120D to cool the chassis 120D.

Figure 8:
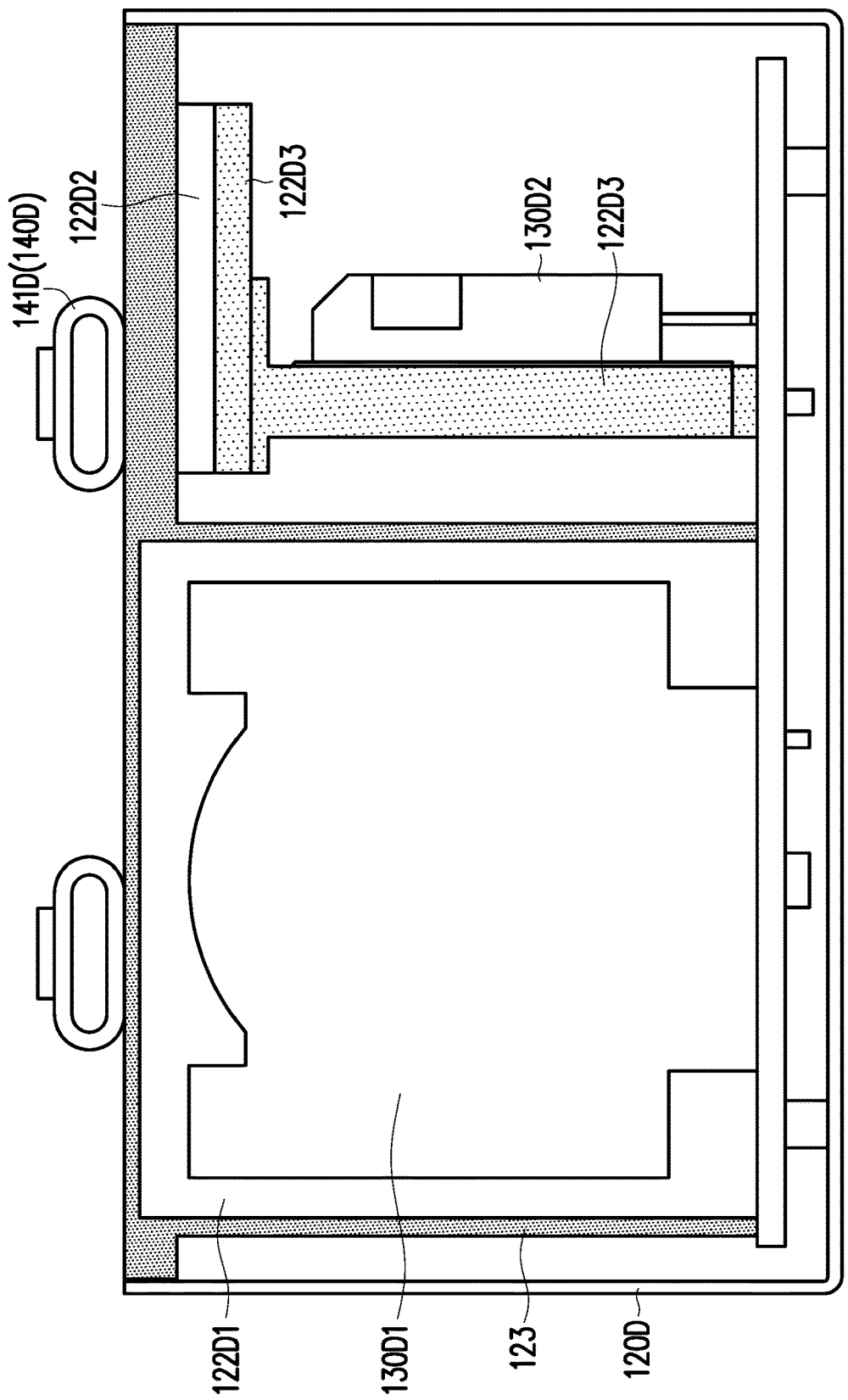
FIG. 8 is a cross-sectional schematic view of a chassis and a cooling unit according to another embodiment of the invention.

FIG. 8 is a cross-sectional schematic view of a chassis and a cooling unit according to another embodiment of the invention. It should be noted that the illustration of an outer casing is omitted in FIG. 8. Please refer to FIG. 8. In the embodiment, the chassis 120D is, for example, a PSU chassis. A heat source in the chassis 120D is, for example, a metal oxide semiconductor field effect transistor (MOSFET), a transformer, a PCBA, etc. The cooling system 100D is a liquid-cooling power shelf handling high power output with high power density.

In detail, in the embodiment, an accommodation portion 123 and a heat conduction unit are disposed in the chassis 120D. The accommodation portion 123 is, for example, a potting casing, which may be optionally used as an upper cover of the chassis 120D. The heat conduction unit includes a potting adhesive 122D1, a heat conduction pad 122D2, a heat dissipation sheet 122D3, but the invention is not limited thereto.

In the embodiment, a heat source such as a transformer 130D1 is disposed in the accommodation portion 123. The potting adhesive 122D1 is filled between the accommodation portion 123 and the transformer 130D1. The thermal conductivity of the potting adhesive 122D1 is preferably at least 2.0 W/mK, so that heat can be effectively transferred from the transformer 130D1 to the accommodation portion 123, then in contact with the chassis 120D, and taken away by the liquid (the coolant) flowing in the tube 141D. The thermal conductivity of the potting adhesive 122D1 is at least 2.0 W/mK, but the invention is not limited thereto.

In the embodiment, another heat source such as a MOSFET 130D2 is connected to the heat dissipation sheet 122D3, so that heat can be effectively transferred from the MOSFET 130D2 to the heat dissipation sheet 122D3, then to the heat conduction pad 122D2 and contact with the chassis 120D, and taken away by the liquid (the coolant) flowing in the tube 141D.

Figure 9:
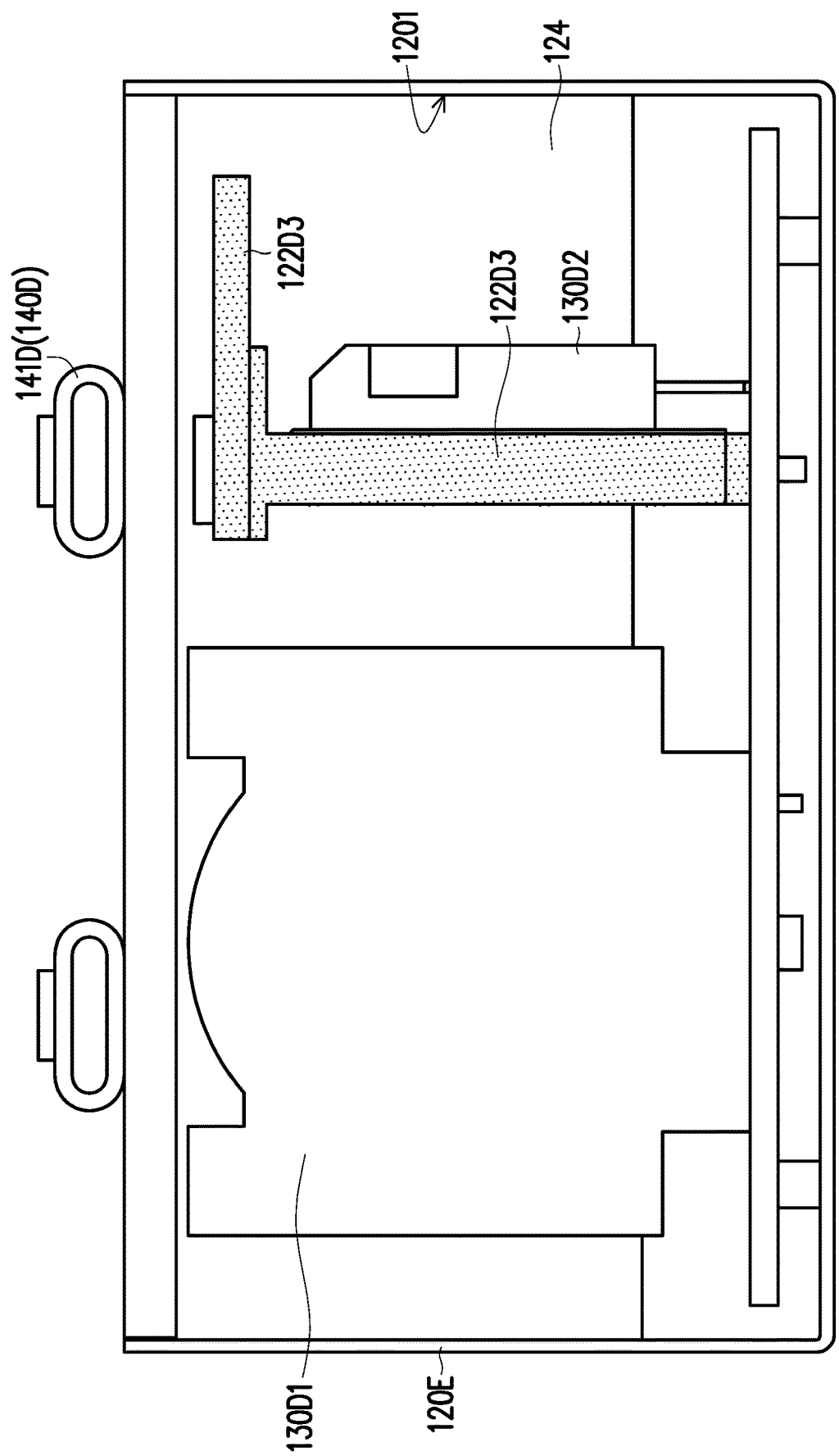
FIG. 9 is a cross-sectional schematic view of a chassis and a cooling unit according to another embodiment of the invention.

FIG. 9 is a cross-sectional schematic view of a chassis and a cooling unit according to another embodiment of the invention. Please refer to FIG. 9. In the embodiment, a cooling colloid is arranged between an inner surface 1201 of a chassis 120E and a heat source (for example, the transformer 130D1 and the MOSFET 130D2) to quickly transfer heat to the tube 141D for dissipation. Here, the cooling colloid 124 completely or partially covers the heat source, but the invention is not limited thereto.

Figure 10A:
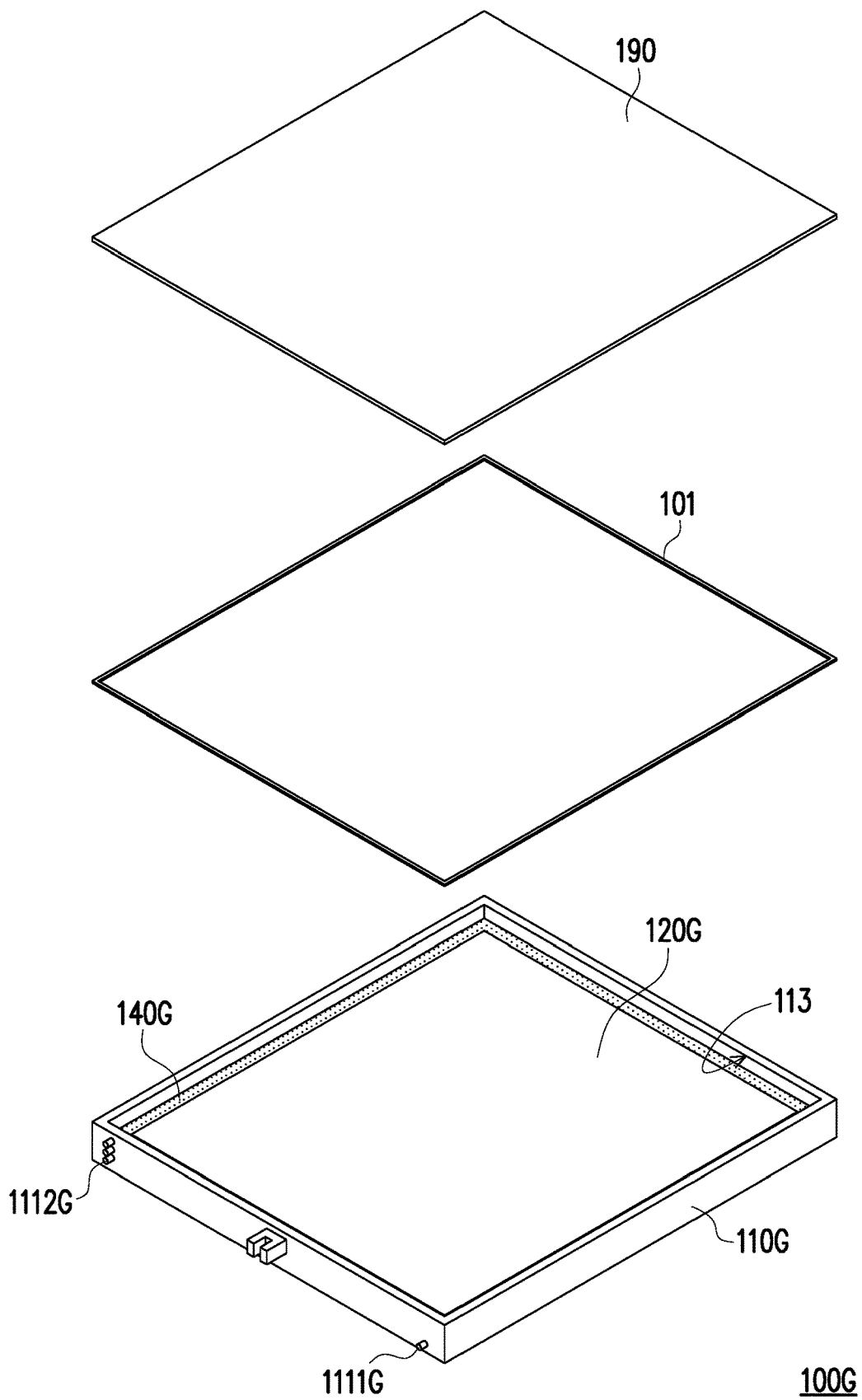
FIG. 10A is a disassembled schematic view of a cooling system according to an embodiment of the invention.
Figure 10B:
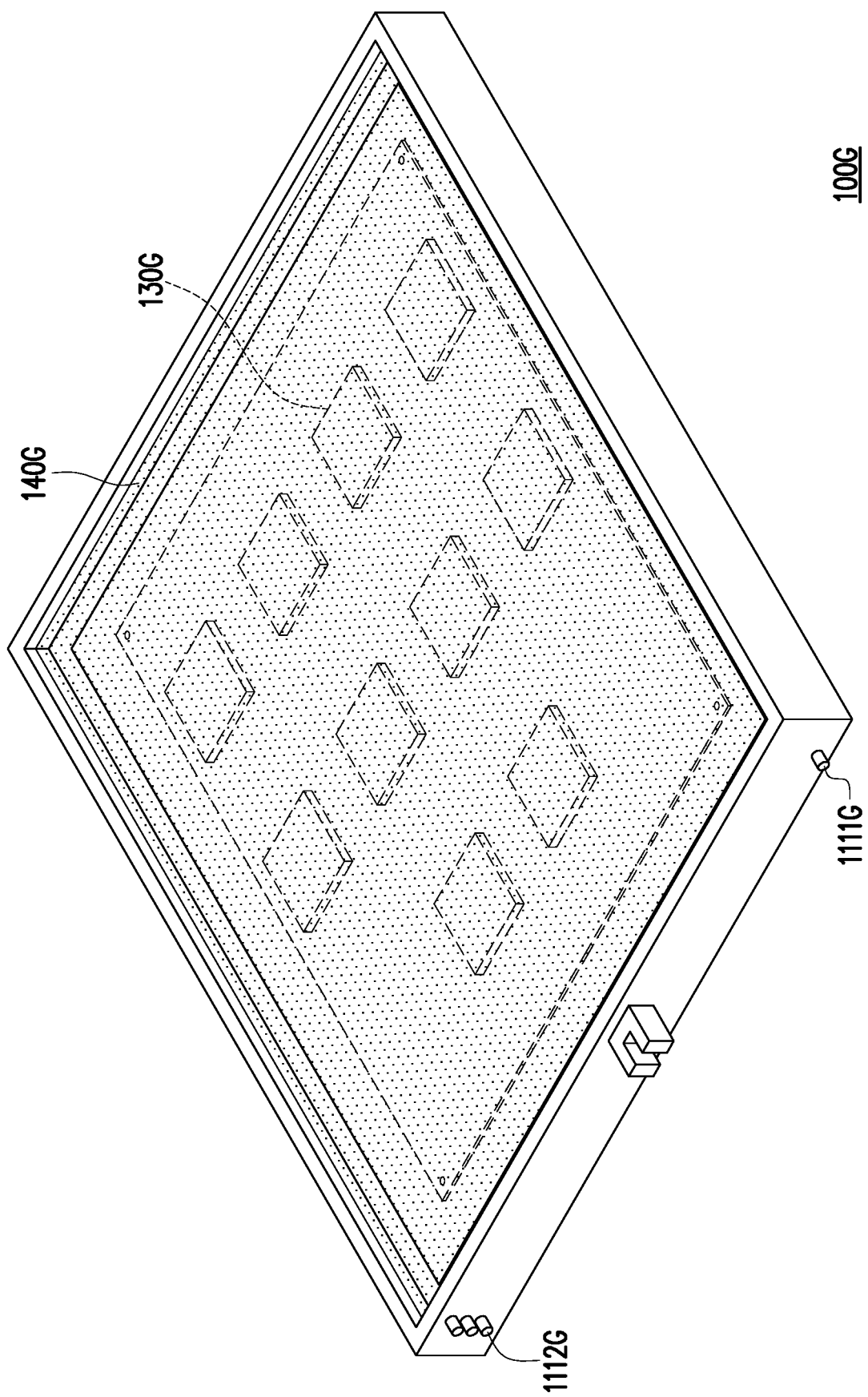
FIG. 10B is a schematic view of some elements of the cooling system of FIG. 10A.

FIG. 10A is a disassembled schematic view of a cooling system according to an embodiment of the invention. FIG. 10B is a schematic view of some elements of the cooling system of FIG. 10A. Please refer to FIG. 10A and FIG. 10B. In the embodiment, a cooling system 100G includes a cover plate 190. An outer casing 110G includes a water inlet 1111G and a water outlet 1112G and has an opening 113.

In the embodiment, the cover plate 190 covers the opening 113 to form a chamber with the outer casing 110G. The chassis 120G is disposed in the chamber. The cooling system 100G further includes a sealing ring 101 disposed between the cover plate 190 and the outer casing 110G to prevent leakage. Specifically, a cooling unit is a coolant 140G filled into the chamber, which may cool the chassis 120G and a heat source 130G therein. The liquid level and the volume of the coolant 140G may be controlled through the water inlet 1111G and the water outlet 1112G, and an open-framed server or PSU may be directly installed in the outer casing 110G, but the invention is not limited thereto.

Such configuration can reduce the size of the cooling system, suitable for the installation on the rack, reduce the waste of the coolant, and improve the cooling efficiency. The specific operation includes the following steps. First, the coolant 140G is pumped in through the water inlet 1111G. Next, the coolant 140G is accumulated until the hot component chassis 120G and the heat source 130G are immersed by the coolant 140G to be cooled down. Next, the coolant 140G carrying heat from the hot components is pumped out through the water outlet 1112G. Thus, the heat is carried away and leaves the hot components. In an embodiment, the coolant 140G works in a single phase and directly contacts the heat source 130G. The coolant is, for example, water, but the invention is not limited thereto.

Figure 11:
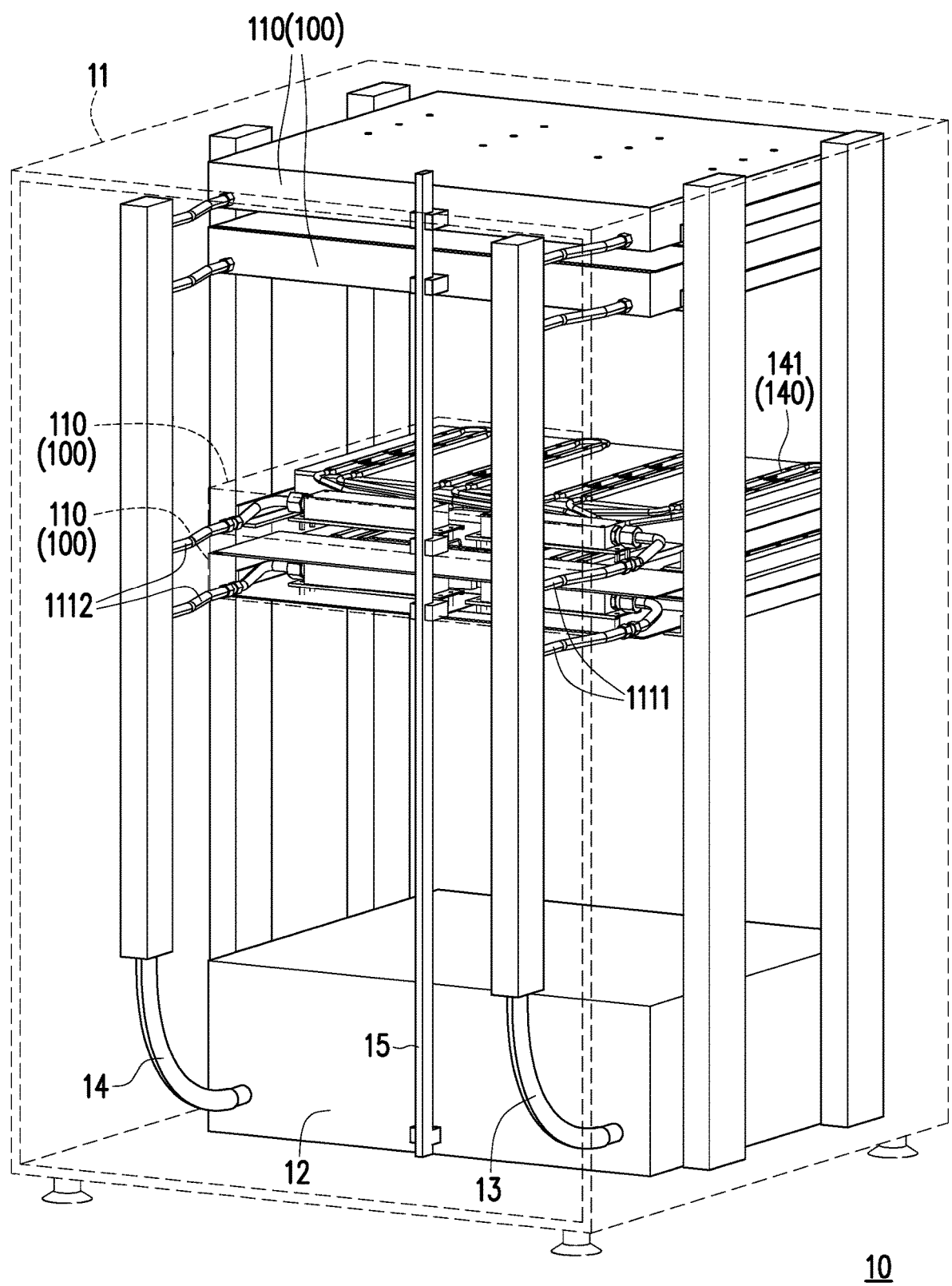
FIG. 11 is a perspective view of a rack according to an embodiment of the invention.

FIG. 11 is a perspective view of a rack according to an embodiment of the invention. It should be noted that a part of a rack body and an outer casing of a cooling system are shown by dotted lines to clearly illustrate the interior.

Please refer to FIG. 11. A rack 10 of the embodiment is a data center rack and is used to accommodate a server, a power shelf, a busbar, cables, and other information technology equipment (ITE). In an embodiment, the rack 10 is, for example, an opened rack that allows airflow to pass through. In another embodiment, the rack 10 may be a closed rack that includes a front door or a rear door, but the invention is not limited thereto.

In the embodiment, the rack 10 includes a rack body 11. Taking the cooling system 100 of FIG. 1A as an example, cooling systems 100 are adapted to be disposed on different layers of the rack body 11. The cooling systems may be one or any combination of the cooling systems 100, 100D, and 100G. The rack body 11 is usually made of steel, but the invention is not limited thereto.

In the embodiment, the rack 10 further includes a busbar 15 and a coolant distribution unit (CDU) 12. The server and the PSU chassis in the cooling system 100 are both electrically connected to the busbar 15 to form a power loop, and the PSU provides power input for the server and the CDU. The coolant distribution unit 12 includes a pump, a liquid storage, a heat exchanger (liquid-to-liquid or liquid-to-air), a sensor, and a controller, but the invention is not limited thereto.

In the embodiment, the coolant distribution unit 12 is disposed on the rack body 11 and includes a first circulation path 13 and a second circulation path 14. The first circulation path 13 connects the coolant distribution unit 12 and two or more water inlets 1111, and the second circulation path 14 connects the coolant distribution unit 12 and two or more water outlets 1112. The working manner in the rack 10 is that: first, the pump in the coolant distribution unit 12 pumps the coolant into the first circulation path 13. Next, the liquid is distributed into the cooling system 100. Next, the liquid flows into the tube 141 of the cooling unit 140 (indirect cooling) or immerses a component (direct cooling) to carry away heat. Next, the hot liquid is pumped back to the coolant distribution unit 12 with the heat exchanger via the second circulation path 14 to dissipate the heat to the environment.

In the foregoing embodiments, the cooling system includes the outer casing, the cooling unit, and the chassis, and the cooling system can dissipate the heat from the heat source in the chassis. However, in other embodiments, the cooling system may not include the chassis, that is, a cooling object of the cooling system is not necessary limited to the chassis, but the invention is not limited thereto.

In summary, in the cooling system of the invention, the chassis can be inserted into or pulled out from the outer casing via the notch of the outer casing. In this way, when loading and unloading the chassis on the rack, there is no need to connect nor disconnect liquid pipelines to the chassis, which is convenient for maintenance and prevents water leakage and potential safety hazards. In addition, when the chassis is inserted into the outer casing, the tube is pushed to be lifted up and abuts against the elastic member. The reaction force or the pressure generated thereby enables the tube to be in tight contact with the chassis for effective heat transfer and cooling.

Although the invention has been disclosed in the above embodiments, the embodiments are not intended to limit the invention. Persons skilled in the art may make some changes and modifications without departing from the spirit and scope of the invention. Therefore, the protection scope of the invention shall be defined by the appended claims.

What is claimed is:

1. A cooling system, comprising:
    an outer casing, having a first surface and comprising a water inlet and a water outlet disposed on the first surface;
    a chassis, disposed in the outer casing;
    a heat source, disposed in the chassis; and
    a cooling unit, contacting the chassis and configured to cool the heat source,
    wherein the cooling unit comprises a tube disposed between an inner wall surface of the outer casing and the chassis, a first end of the tube is connected to the water inlet, and a second end of the tube is connected to the water outlet.

2. The cooling system according to claim 1, wherein the outer casing comprises a notch opposite to the first surface, and the chassis is suitable for being inserted into the outer casing via the notch.

3. The cooling system according to claim 1, wherein the tube comprises a U-shaped segment, the U-shaped segment is connected between the first end and the second end, and a lower surface of the U-shaped segment has an inclined surface.

4. The cooling system according to claim 3, wherein the tube comprises a first segment and a second segment arranged side by side, the first segment is connected between the first end and the U-shaped segment, the second segment is connected between the second end and the U-shaped segment, a holder is disposed between the first segment and the second segment, the inner wall surface of the outer casing is provided with a shaft body, and the shaft body is connected to the holder.

5. The cooling system according to claim 4, wherein the inner wall surface of the outer casing is provided with an elastic member disposed between the tube and the inner wall surface of the outer casing.

6. The cooling system according to claim 1, wherein an interconnector is disposed in the outer casing, the interconnector has a channel, an end of the channel is connected to the water inlet or the water outlet, and a first wall surface of the channel has two or more water pipes.

7. The cooling system according to claim 6, wherein a second inner wall of the channel is inclined relative to a first inner wall.

8. The cooling system according to claim 7, wherein there is an included angle between a tangent of the first inner wall and a tangent of the second inner wall, and the included angle is between 88.5 degrees and 87 degrees.

9. The cooling system according to claim 1, wherein an inner wall of the chassis has a heat conduction unit, and the heat source is in contact with the chassis via the heat conduction unit.

10. The cooling system according to claim 1, wherein a cooling colloid is arranged between an inner surface of the chassis and the heat source.

11. The cooling system according to claim 1, further comprising a cover plate, wherein the outer casing has an opening, the cover plate covers the opening to form a chamber with the outer casing, and the chassis is disposed in the chamber.

12. The cooling system according to claim 11, wherein the cooling unit is a coolant filled into the chamber, and the cooling system further comprises a sealing ring disposed between the cover plate and the outer casing.

13. A rack, comprising:
    a rack body; and
    the cooling system according to claim 1, disposed on the rack body.

14. The rack according to claim 13, further comprising a coolant distribution unit, wherein the coolant distribution unit is disposed on the rack body and comprises a first circulation path and a second circulation path, the first circulation path connects the coolant distribution unit and at least two of the water inlets, and the second circulation path connects the coolant distribution unit and at least two of the water outlets.

* * * * *